United States Patent [19]

Sanielevici

[11] Patent Number: 4,885,545
[45] Date of Patent: Dec. 5, 1989

[54] HIGH SPEED CIRCUIT WITH SUPPORTING AUXILIARY CIRCUIT

[75] Inventor: Sergio A. Sanielevici, Portland, Oreg.

[73] Assignee: Tektronix, Inc., Beaverton, Oreg.

[21] Appl. No.: 229,195

[22] Filed: Aug. 8, 1988

[51] Int. Cl.[4] .................... G11C 27/02; H03K 5/159
[52] U.S. Cl. ................................ 328/151; 307/262; 307/353; 307/491; 307/269
[58] Field of Search ............... 307/262, 269, 353, 491; 328/151

[56] References Cited

U.S. PATENT DOCUMENTS

| | | | |
|---|---|---|---|
| 3,789,304 | 1/1974 | May | 307/269 |
| 3,942,124 | 3/1976 | Tarczy-Hornoch | 307/269 |
| 4,507,621 | 3/1985 | Meyer | 307/269 |

Primary Examiner—John Zazworsky
Attorney, Agent, or Firm—Edward B Anderson; Robert S. Hulse

[57] ABSTRACT

A sample-and-hold circuit for sampling a time-varying signal comprises a main sample-and-hold subcircuit extending between input and output terminals and an auxiliary sample-and-hold subcircuit extending between the input terminal and a portion of the main subcircuit. Each sample-and-hold subcircuit comprises an input buffer amplifier, a diode-bridge switch responsive to a control signal and coupled to the input buffer amplifier, a charge-holding capacitor coupled to the switch, and an output buffer amplifier coupled to the capacitor. The output of the auxiliary output amplifier is further coupled to the main switch and the output of the main output amplifier is coupled to the output terminal. A generator generates the control signal for controlling the switches such that the same part of the time-varying signal passing through the main and auxiliary subcircuits is sampled. The time-varying signal passing through the main subcircuit is delayed such that the time-varying signals traveling through the main and auxiliary subcircuits reach the main switch at substantially the same time. The auxiliary subcircuit has a charge-holding capacitor extending between the switch output and ground. The main subcircuit charge-holding capacitor extends between the outputs of the main and axuiliary switch outputs so that the main capacitor only charges to a differential voltage existing between the two switch outputs.

13 Claims, 3 Drawing Sheets

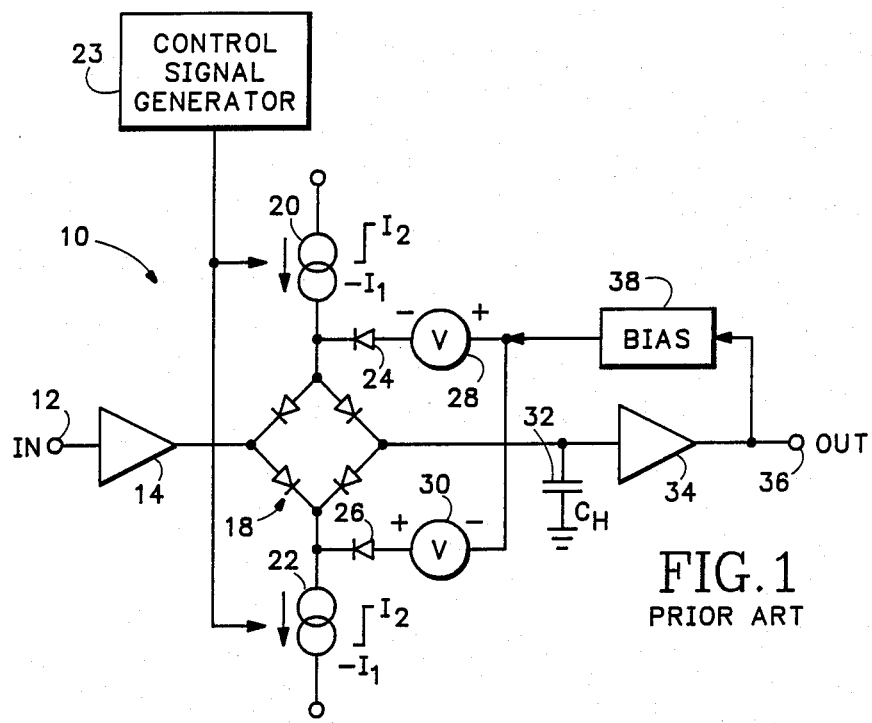
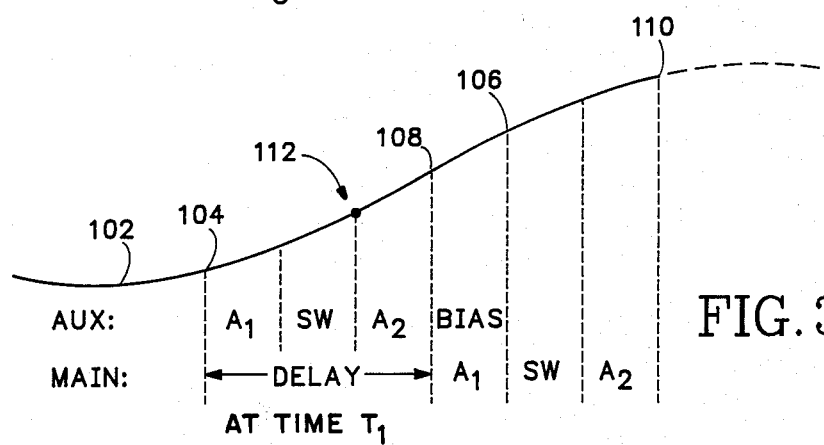
FIG. 3
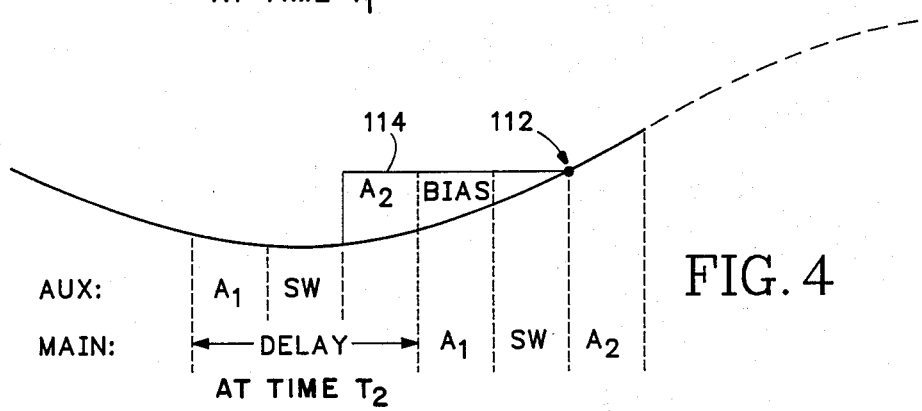
FIG. 4

HIGH SPEED CIRCUIT WITH SUPPORTING AUXILIARY CIRCUIT

FIELD OF THE INVENTION

This invention relates generally to high speed circuits requiring transmission of a signal along two paths having ends common to one of the paths, such as by feedback. More specifically the present invention provides for a main circuit and an auxiliary circuit substantially identical to the main circuit for providing the two paths.

BACKGROUND OF THE INVENTION

The present invention relates generally to high speed circuits where the timing of signals occurring in a main path and an auxiliary path, such as in a feedback path, is critical. Although not limited to such an application, one circuit type where this is particularly true is a sample-and-hold circuit. Sample-and-hold circuits are often used on the input of an analog-to-digital converter for providing a stable input signal for the converter. High speed converters are becoming very common as digital signal processing of high frequency signals is undertaken.

Sample-and-hold circuits typically employ an analog switching device, generally referred to as a sampling gate, for periodically connecting a capacitor to an input signal to be sampled. During the tracking state, the capacitor is connected to the signal so that it charges and discharges to track the voltage level of the signal. In the hold state, the switch is turned off, disconnecting the capacitor from the input signal. The capacitor holds that voltage level existing on the input signal at the time the capacitor is disconnected. The charge on the capacitor should stay constant, providing a constant output voltage.

The capacitor is also typically connected to a high impedance input of a buffer amplifier which provides the hold output signal of the sample-and-hold circuit, the high impedance input ensuring minimal discharge of the capacitor during the hold phase of the circuit operation.

The switches used in sample and hold circuits are typically either Schottky diode bridges or field-effect transistors. The diode bridge, which is perhaps the simplest of the switches, is switched by a pair of controlled current sources. These basic circuits however have significant blow-by distortion caused by the input signal coupling to the output during the hold state due to diode capacitances.

This has been improved upon by the addition of a diode at each corner of the bridge associated with the current sources. A fixed bias is applied to the diodes to provide a low impedance path to ground for the blow-by current in the hold state. Since the bias is fixed, though, the charge injected into the hold capacitor at the switching off of the diode bridge varies with the magnitude of the input signal disproportionately, thereby producing nonlinearity in the relationship of the held charge on the input signal represented by it.

This in turn has been overcome in conventional circuits by bootstrapping the bias voltage from the sample-and-hold output. Such a circuit is shown generally at 10 in FIG. 1. Circuit 10 includes an input terminal 12 for receiving the input signal to be sampled. This terminal is connected to an input buffer amplifier 14.

The output of amplifier 14 is input into a Schottky diode bridge 1 which is controlled by a pair of current sources 20 and 22. These current sources receive a control signal from a control signal generator 23. The diode bridge adjacent each current source has blow-by current shunt diodes 24 and 26 which are biased by fixed voltage sources 28 and 30. The output of the switch is coupled to a hold capacitor 32, one side of which is grounded. This capacitor tracks the input signal during the track state and holds a charge proportional to the input signal when in the hold state. The capacitor is coupled to output amplifier 34 for outputting the output signal on an output terminal 36. As has been mentioned, the bias voltages for diodes 24 and 26 are bootstrapped from the circuit output through a bias circuit 38.

This circuit configuration is more effective than prior versions of the circuit. However, in high speed applications, it tends to have limited use because of the longer settling time required by the bootstrapping arrangement. This is due primarily to the time delay in the signal propagating to the output and then feeding back to the operative circuit component, such as the switch or amplifier.

Conventional sample-and-hold circuits also typically have a hold capacitor which is grounded so that it must take the complete charge of the input signal. Thus, changes in charge take more time than if less stored charge was required.

SUMMARY OF THE INVENTION

The present invention overcomes the disadvantage of prior art circuits generally, and sample-and-hold circuits in particular, such as the one shown in Fig. 1, by providing a referencing voltage source on a main signal path which has fast settling times. This aspect of the invention is provided in a circuit for processing a time-varying signal comprising a main subcircuit coupled between an input and an output terminal for conducting the time-varying signal along a first path. An auxiliary subcircuit substantially identical to at least a portion of the main subcircuit and coupled between the input terminal and the main subcircuit conducts the time-varying signal along a second path. A delay subcircuit delays the time of propagation of the time-varying signal along one of the first and second paths so that the time-varying signal at a selected point along the first path has a predetermined time relationship with respect to the time-varying signal traveling along the second path at the point it is fed to the main subcircuit.

In a preferred embodiment of the invention, a sample-and-hold circuit for sampling a time-varying signal is provided. Included are a main sample-and-hold subcircuit and an auxiliary sample-and-hold subcircuit. Each sample-and-hold subcircuit comprises an input buffer amplifier coupled to an input terminal, a diode-bridge switch responsive to a control signal and coupled to the input buffer amplifier, a charge-holding capacitor coupled to the switch, and an output buffer amplifier coupled to the capacitor. The output of the auxiliary output amplifier further is coupled to the main switch and the output of the main output amplifier is coupled to the output terminal. A control-signal generator generates the signal for controlling the switches such that the same part of the time-varying signal passing through the main and auxiliary subcircuits is sampled. Finally, a delay subcircuit delays the time-varying signal passing through the main subcircuit such that the time-varying signals traveling through the main and auxiliary subcircuits reach the main switch at substantially the same time.

One aspect of the present invention also further enhances high speed operation by providing a hold capacitor which only tracks and holds a small charge, thereby charging more quickly. In the preferred embodiment, this is provided by an auxiliary sample-and-hold subcircuit wherein an auxiliary charge-holding capacitor is coupled to a switch for holding substantially the voltage of the time-varying signal received through the auxiliary switch. A main charge-holding capacitor coupled between the outputs of main and auxiliary switches holds the difference in voltage between the voltage of the time-varying signal received through the main switch and the voltage on the auxiliary capacitor.

It will be seen that such circuits provide for fast operation in that settling times are avoided by use of an auxiliary subcircuit from which the signal is obtained. This and other features and advantages of the present invention will become apparent from a review of the drawings in conjunction with the following detailed description of the preferred embodiments.

BRIEF DESCRIPTION OF THE DRAWINGS

FIG. 1 is a block diagram of a conventional sample-and-hold circuit.

FIGS. 3 and 4 are sample waveforms of a signal in the circuit of FIG. 2 at two different times.

DETAILED DESCRIPTION OF THE PREFERRED EMBODIMENTS

Figure 2:
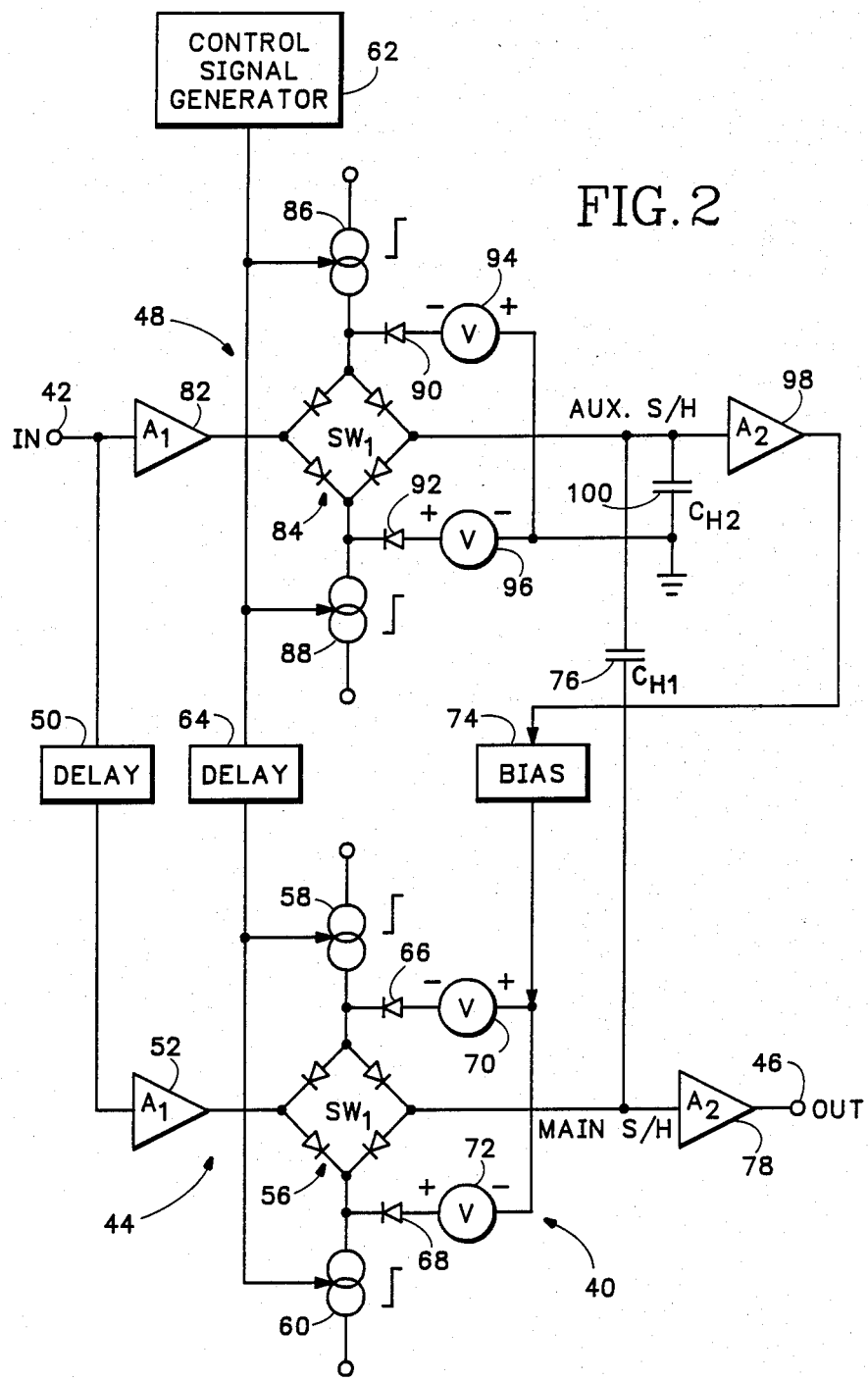
FIG. 2 is a block diagram of a sample-and-hold circuit made according to the present invention.

FIG. 1 is described in the section entitled Background of the Invention.

A sample-and-hold circuit 40 made according to the invention is shown in FIG. 2. The circuit of FIG. 2, similar to the circuit of FIG. 1, includes an input terminal 42, a main sample-and-hold subcircuit 44, and an output terminal 46, all defining what may be referred to as a first signal path. A second signal path is defined by an auxiliary sample-and-hold subcircuit 48 substantially identical in its main elements, as will be seen, as main subcircuit 44. Further, a delay element 50, such as is provided conventionally by a transmission line, is posed between the input terminal and the input to main subcircuit 44.

Main subcircuit 44 includes an input buffer amplifier 52 of conventional and well known design connected to delay unit 50. The output of the amplifier is also input into a conventional Schottky diode bridge forming a sampling gate switch 56, similar to bridge 18 of FIG. 1. It is driven by two controllable current sources 58 and 60. Sources 58 and 60 are controlled by a control signal received from a control signal generator 62 of conventional design. The generator generates the signals which determine when the circuit is in a track state and when it is in a hold state. When current is flowing through the switch, it is in a track state, and correspondingly, when current is not flowing through the switch, it is in a hold state. The control signal passes through another delay element 64 for delaying the time that the control signal reaches the current sources of the main subcircuit.

The diode bridge also has a pair of blow-by current shunting diodes 66 and 68 and associated voltage sources 70 and 72. These are fed from a bias subcircuit 74.

The output of the switch is connected to one terminal of a hold or memory capacitor 76 which is connected between the main and auxiliary subcircuits as will be further described below. The switch output is also input to an output buffer amplifier 78 of conventional design, the output of which is connected to output terminal 46. The portion of main subcircuit 44 up to amplifier 78 is referred to as a main first portion, and amplifier 78 is referred to a main second portion.

Auxiliary subcircuit 48 is structured substantially identically to main subcircuit 44 and includes an input amplifier 82, diode bridge switch 84, current sources 86 and 88, blow-by diodes 90 and 92, associated voltage sources 94 and 96, and output amplifier 98. As with the main subcircuit, the portion of auxiliary subcircuit 48 up to amplifier 98 is also referred to as an auxiliary first portion, and amplifier 98 is referred to as an auxiliary second portion. The output of amplifier 98 is used as the voltage source for bias circuit 74 also referred to as a supplemental subcircuit. The current sources are connected to receive the control signals directly from generator 62. A hold capacitor 100 is connected conventionally between the output of switch 84 and ground. Capacitor 76 is connected between the two outputs of switches 56 and 84. Auxiliary subcircuit 48 is thus a basic sample-and-hold circuit without bootstrapping of the blow-by diodes associated with the switch.

It can be seen that what is provided by circuit 40 is a pair of substantially identical sample-and-hold circuits, essentially in parallel, and both receiving the same input signal. However, one of the circuits receives the input signal delayed relative to the other. The circuit which receives the input signal is used to generate what would normally be the feedback or bootstrap voltages for the circuit with the delayed signal.

The preferred timing of the two signals in the two circuits is illustrated in FIGS. 3 and 4. In these figures an input signal 102 is shown as it appears in the two subcircuits at two points in time. For simplicity, it is assumed that the propagation delay of the signal through the subcircuit components is in equal increments, as represented by the vertical dashed lines.

FIG. 3 represents the existence of the signal at a first time, $T_1$. The signal level is level is lowest at 104, the input to auxiliary input amplifier 82 and rises through the auxiliary subcircuit to its highest point 106 at the output of bias circuit 74. It will be appreciated that this time varying input signal does not in actuality have the same voltage level as it progresses through the circuit. However, it is shown as having values of the said scale throughout so that its progress through the circuit will be more apparent. The figures are thus primarily illustrative of the timing of the signal.

The delay provided by delay element 50 is set to be equal to the time of propagation of the signal through the input amplifier, switch and output amplifier of the auxiliary subcircuit. If the various delays are not equal, then the difference in propagation time through the bias circuit and the main input amplifier would also need to be included. Thus, the signal at point 108 is at the input of the main input amplifier, while the output signal, assuming the circuit is in the track state, is shown by point 110. At instant $T_1$ control signal generator 62 outputs a signal to switch to the hold state. Thus, auxiliary switch 84 switches so that the signal at the output of the switch at point 112 is held on capacitor 100.

FIG. 4 illustrates the location of the input signal throughout circuit 40 at a second instant in time, $T_2$. At this instant point 112 of the signal is at the output of main switch 56. The input signal voltage has been held on capacitor 100 since $T_1$, as represented by the horizontal line segment 114. The held value of the signal has thus had time to propagate along path two through auxiliary output amplifier 98, bias circuit 74 and switch 56. Along path one, the signal has propagated through delay element 50, main amplifier 52 and switch 56. The control signal from generator 62 has also been delayed by element 64 so that the change from track state to hold state in the main subcircuit occurs at time $T_2$.

The signals along paths one and two thus arrive at switch 56 in phase. That is to say, the same point on the input signal reaches the switch along the two paths at substantially the same time. Since the auxiliary subcircuit has been in a hold state since time $T_1$, the voltage levels have had time to settle and the biasing signal fed to the main subcircuit is advanced in time compared to what it would be if the output of the main subcircuit was bootstrapped. There is thus a savings in the delay time that it would take the signal to propagate through the main output amplifier 98, bias subcircuit 74 and switch 56 so that it could settle to a relatively steady state output.

An important aspect of the present invention is illustrated in the circuit of FIG. 2 wherein the hold capacitor of the main sample-and-hold subcircuit is coupled between the output of the main switch and the auxiliary capacitor. Since the auxiliary capacitor is coupled to ground, it holds the voltage of the input signal on it. The main capacitor therefore only holds any voltage differential which exists between the voltage on the auxiliary capacitor and the voltage output from the main switch. Thus, the main capacitor has very small charge variations with variations in the input signal. The main diode bridge bias current is therefore much lower than that of the auxiliary diode bridge. Further, the main input buffer has less driving to do.

This is particularly true in the hold state, wherein the voltage held on the auxiliary hold capacitor is substantially the same as the voltage at the output of the main diode bridge. The differential voltage is then quite small in comparison. The charge time of the main hold capacitor is correspondingly quite small.

Although the delay times have been treated idealistically and simplistically, it will be appreciated by those skilled in the art that the actual delay times incorporated in practicing the present invention are preferably verified, if not actually determined, on an empirical basis, for each circuit, so that inherent variations in circuit components can be compensated for.

It can be seen that the general concept of the present invention, that of using duplicate circuits, with relative delay between signals propagating through the circuits to accomplish desired bootstrapping of signals between the circuits has general applicability. It will therefore be apparent that although the present invention has been described with specific reference to a particular embodiment, other forms and variations of circuits may be envisaged and made without varying from the spirit and scope of the invention as defined in the claims.

I claim:

1. A circuit for processing a time-varying signal comprising:
    an input terminal;
    an output terminal;
    a main subcircuit coupled between said input and output terminals for conducting the time-varying signal along a first path from said input terminal, through said main subcircuit to said output terminal;
    an auxiliary subcircuit substantially identical to at least a portion of said main subcircuit and coupled between said input terminal and said main subcircuit for conducting the time-varying signal along a second path from said input terminal, through at least a portion of said auxiliary subcircuit to said main subcircuit;
    delay means for delaying the time of propagation of the time-varying signal along one of said first and second paths so that the time-varying signal at a selected point along said first path has a predetermined time relationship with respect to the time-varying signal traveling along said second path at the point it is fed to said main subcircuit; and
    supplemental subcircuit means coupled between said auxiliary subcircuit and said main subcircuit and forming art of said second path for further processing the signal along said second path, said delay means compensating for any propagation delay of the signal passing through said supplemental subcircuit means.

2. A circuit for processing a time-varying signal comprising:
    an input terminal;
    an output terminal;
    a main subcircuit coupled between said input and output terminals for conducting the time-varying signal along a first path from said input terminal, through said main subcircuit to said output terminal;
    an auxiliary subcircuit substantially identical to at least a portion of said main subcircuit and coupled between said input terminal and said main subcircuit for conducting the time-varying signal along a second path from said input terminal, through at least a portion of said auxiliary subcircuit to said main subcircuit; and
    delay means for delaying the time of propagation of the time-varying signal along one of said first and second paths so that the time-varying signal at a selected point along said first path has no delay with respect to the time varying signal traveling along said second path at the point it is fed to said main subcircuit.

3. A circuit for processing a time-varying signal comprising:
    an input terminal;
    an output terminal;
    a main sample-and-hold subcircuit, including a main switch means, a main charge-holding capacitor means and a main output amplifier means, which main subcircuit is coupled between said input and output terminals for conducting the time-varying signal along a first path from said input terminal, through said main subcircuit to said output terminal;
    an auxiliary sample-and-hold subcircuit, including an auxiliary switch means, an auxiliary charge-holding capacitor means and an auxiliary output amplifier means, which auxiliary subcircuit is coupled between said input terminal and said main switch means for conducting the time-varying signal along a second path from said input terminal, through said auxiliary subcircuit to said main switch means for biasing said main switch means; and delay means for delaying the time of propagation of the time-varying signal along one of said first and second paths so that the time-varying signal at a selected point along said first path has a predetermined time relationship with respect to the time-varying signal traveling along said second path at the point it is fed to said main subcircuit.

4. A circuit according to claim 3 wherein said delay means delays the signal in said first path so that there is substantially no delay between the two signals input to said main switch means.

5. A circuit according to claim 3 further comprising control signal generating means coupled to said auxiliary and main switch means for generating a control signal appropriate for sampling, respectively, the same point of the time-varying signal along said first and second paths.

6. A circuit according to claim 5 wherein said control-signal-generating means generates a single control signal and delays the transmission of the control signal to said main switch means relative to the transmission of the control signal to said auxiliary switch means.

7. A circuit for processing a time-varying signal comprising:
an input terminal;
an output terminal;
a main subcircuit having a main first portion coupled to said input terminal and a main second portion coupled between said main first portion and said output terminal, said main subcircuit defining a first path of transmission of the time-varying signal;
an auxiliary subcircuit having an auxiliary first portion coupled to said input terminal and an auxiliary second portion coupled between said auxiliary first portion and said main first portion, said auxiliary first and second portions being substantially identical to said main first and second portions;
delay means for delaying the time of propagation of the time-varying signal from said input terminal along said first path to said main first portion so that the delayed time-varying signal has a predetermined time relationship with respect to the time-varying signal fed along said second path to said main first portion from said auxiliary second portion; and
a supplemental subcircuit coupled between said auxiliary subcircuit and said main subcircuit and forming part of said second path for further processing the signal along said second path, said delay means compensating for any propagation delay of the signal passing through said supplemental subcircuit.

8. A circuit according to claim 7 wherein said predetermined time relationship is that there is substantially no delay between the signals at said main first portion.

9. A sample-and-hold circuit for sampling a time-varying signal comprising:
an input terminal;
an output terminal;
a main sample-and-hold subcircuit and an auxiliary sample-and-hold subcircuit, each sample-and-hold subcircuit comprising an input buffer amplifier coupled to said input terminal, a diode-bridge switch means responsive to a control signal and coupled to said input buffer amplifier, a charge-holding capacitor coupled to said switch means, and an output buffer amplifier coupled to said capacitor; the output of said auxiliary output amplifier further being coupled to said main switch means and the output of said main output amplifier being coupled to said output terminal;
control-signal-generating means for generating the signal for controlling said switch means such that the same part of the time-varying signal passing through said main and auxiliary subcircuits is sampled; and
delay means for delaying the time-varying signal passing through said main subcircuit such that the time-varying signals traveling through said main and auxiliary subcircuits reach said main switch means at substantially the same time.

10. A sample-and-hold circuit according to claim 9 further comprising switch-biasing means posed between said auxiliary output amplifier and said main switch means for biasing said switch means with the signal output from said auxiliary output amplifier, said delay means compensating for any propagation delay of the signal passing through said switch-biasing means.

11. A sample-and-hold circuit according to claim 9 wherein said delay means delays the time-varying signal before it enters said main subcircuit.

12. A sample-and-hold circuit according to claim 9 wherein said auxiliary capacitor is coupled for storing the voltage of the time-varying signal received from said auxiliary switch means and said main capacitor is coupled between the outputs of said main and auxiliary switch means for storing the difference in voltage between the voltage of the time-varying signal output from said main switch means and the voltage on said auxiliary capacitor.

13. A sample-and-hold circuit for sampling a time-varying signal comprising:
an input terminal for receiving the time-varying signal;
an output terminal;
an auxiliary sample-and-hold subcircuit comprising auxiliary switch means responsive to a control signal and coupled to said input terminal, and an auxiliary charge-holding capacitor coupled to said switch means for holding substantially the voltage of the time-varying signal received through said auxiliary switch means,
a main sample-and-hold subcircuit comprising main switch means responsive to a control signal and coupled between said input and output terminals, and a main charge-holding capacitor coupled between the outputs of said main and auxiliary switch means for holding substantially the difference in voltage between the voltage of the time-varying signal received through said main switch means and the voltage on said auxiliary capacitor; and
control-signal-generating means for generating the signals for controlling said auxiliary and main switch means between a tracking state wherein the input time-varying signal is passed from said input terminal to said auxiliary and main capacitors, and a holding stae wherein the charge existing on said auxiliary and main capacitors is held substantially at the level existing at the beginning of the holding state.

* * * * *